United States Patent
Ma et al.

(10) Patent No.: US 9,337,157 B2
(45) Date of Patent: May 10, 2016

(54) MINIATURE PASSIVE STRUCTURES FOR ESD PROTECTION AND INPUT AND OUTPUT MATCHING

(75) Inventors: Kai Xue Ma, Singapore (SG); Yang Lu, Singapore (SG); Jiangmin Gu, Singapore (SG); Kiat Seng Yeo, Singapore (SG)

(73) Assignee: Nanyang Technological University, Singapore (SG)

( * ) Notice: Subject to any disclaimer, the term of this patent is extended or adjusted under 35 U.S.C. 154(b) by 247 days.

(21) Appl. No.: 13/880,481

(22) PCT Filed: Oct. 20, 2011

(86) PCT No.: PCT/SG2011/000367
§ 371 (c)(1),
(2), (4) Date: Oct. 29, 2013

(87) PCT Pub. No.: WO2012/053981
PCT Pub. Date: Apr. 26, 2012

(65) Prior Publication Data
US 2014/0049862 A1    Feb. 20, 2014

Related U.S. Application Data

(60) Provisional application No. 61/394,788, filed on Oct. 20, 2010.

(51) Int. Cl.
*H01L 23/60* (2006.01)
*H01L 23/66* (2006.01)
*H01L 23/00* (2006.01)

(52) U.S. Cl.
CPC ................ *H01L 23/60* (2013.01); *H01L 23/66* (2013.01); *H01L 24/05* (2013.01); *H01L 2223/6627* (2013.01); *H01L 2223/6666* (2013.01); *H01L 2924/13034* (2013.01); *H01L 2924/13091* (2013.01)

(58) Field of Classification Search
CPC ........................................................ H01L 23/60
USPC ........................................ 333/12; 361/56, 118
See application file for complete search history.

(56) References Cited

U.S. PATENT DOCUMENTS

| 6,011,446 A * | 1/2000 | Woods ........................ 331/185 |
| 6,509,779 B2 * | 1/2003 | Yue .......................... H01L 23/60 327/309 |
| 7,224,180 B2 * | 5/2007 | Hargrove ................ H01L 23/60 326/26 |
| 2008/0112101 A1 * | 5/2008 | McElwee et al. ............... 361/56 |

* cited by examiner

*Primary Examiner* — Dean Takaoka
*Assistant Examiner* — Alan Wong
(74) *Attorney, Agent, or Firm* — K. David Crockett, Esq.; Niky Economy Syrengelas, Esq.; Crockett & Crockett, PC (57) ABSTRACT

A miniature passive structure for electrostatic discharge (ESD) protection and input/output (I/O) matching for a high frequency integrated circuit is provided. The miniature passive structure includes at least one shunt stub and at least one load line. The shunt stub(s) each provide a corresponding ESD discharge path. The load line(s) are coupled to the shunt stub(s) and provide loading effects for the shunt stub(s).

20 Claims, 12 Drawing Sheets

MINIATURE PASSIVE STRUCTURES FOR ESD PROTECTION AND INPUT AND OUTPUT MATCHING

CROSS-REFERENCE TO RELATED APPLICATION

The present application claims priority to U.S. Provisional Patent Application No. 61/394,788, filed Oct. 20, 2010.

FIELD OF THE INVENTION

The present invention generally relates to structures for electrostatic discharge (ESD) protection, and more particularly relates to miniaturized passive structures for ESD protection.

BACKGROUND OF THE DISCLOSURE

Electrostatic discharge (ESD) generally refers to the sudden and transient electric current flowing between two objects with different potentials, the different potentials being caused by static charge accumulation. ESD events have been modeled by various standards bodies for compliance testing purposes. These ESD event models include the American National Standards Institute (ANSI) model and the ESD Association's Human Body Model (HBM), Machine Model (MM) and Charged Device Model (CDM). These models typically specify certain ESD event circuit models, each including a charging capacitor that stores the accumulated static charge to a certain ESD voltage level and a current limiting resistor to mimic the resistance in the ESD discharge path. During an ESD event, the two terminals of the charged capacitor are brought in contact with any two I/O pins of an integrated circuit (IC), the discharge current flows there through, and the static charge is neutralized.

An integrated circuit is susceptible to ESD strikes during fabrication, testing, packaging, transportation, and use. Accordingly, on-chip ESD protection circuits are imperative for an IC to achieve reasonable stability. The ever-shrinking IC process technologies that enable very high-frequency operations are generally more vulnerable to ESD events because of their small fabrication geometry. However, the conventional ESD protection methods generally introduce excessive parasitic effect, which substantially limit the performance of the high-speed input and output ports leaving a very stringent design trade-off between the IC's performance and the IC's reliability.

Conventional ESD methods for integrated circuits use devices such as diodes, silicon-controlled rectifiers (SCRs), grounded-gate n-channel MOSFETs (ggNMOSs). These methods protect the internal circuits by shunting the ESD current to ground or power supply rails during ESD event, where the potentials between the power supply rails are clamped using power clamps. Such ESD devices introduce certain parasitic impedance into the circuit being protected. This parasitic impedance could be utilized as a matching element. However, for high frequency analog and digital applications in the RF, microwave and millimeter-wave regime, the distributed effects of these conventional protection structures becomes significant. These effects can distort and deteriorate the interested signal being processing and bring about poor performance or even malfunction of the circuits being protected.

Consequently, different ESD protection methods need to be developed for high frequency I/O ports in integrated circuits, at which the distributed effects of the circuit devices are significant. Thus, what is needed is a scheme of distributed ESD protection devices to absorb the parasitic effects of the protection devices in a transmission line. Transmission lines can be employed to exhibits certain desirable impedance to the high frequency signal while bypass the ESD current to ESD protection devices or ground. Furthermore, other desirable features and characteristics will become apparent from the subsequent detailed description and the appended claims, taken in conjunction with the accompanying drawings and this background of the disclosure.

SUMMARY

According to the Detailed Description, a miniature passive structure for electrostatic discharge (ESD) protection and input/output (I/O) matching for a high frequency, RF, microwave and millimeter-wave integrated circuit is provided. The miniature passive structure includes at least one shunt stub and at least one load line. The shunt stub(s) each provide a corresponding ESD discharge path. The load line(s) are coupled to the shunt stub(s) and provide loading effects for the shunt stub(s).

In addition, a high frequency ESD protection network for integrated circuits is provided. The integrated circuits are based on either CMOS, GaAs, SiGe, or InP integrated circuit technology and the high frequency ESD protection network includes a high frequency signal carrying transmission line and one or more miniature passive structures. Each of the miniature passive structures includes at least one shunt stub and at least one load line. The shunt stub(s) provide at least one ESD discharge path and the load line(s) are coupled to the shunt stub(s) for providing loading effects for the shunt stub(s).

Further, a high frequency ESD protection scheme for integrated circuits is provided. The high frequency ESD protection scheme includes power supply rails, a supply clamp and a high frequency ESD protection network. The supply clamp provides transient clamping of the electrical potential difference between the power supply rails. And the high frequency ESD protection network includes a high frequency signal carrying transmission line and one or more miniature passive structures. Each of the one or more miniature passive structures includes at least one shunt stub and at least one load line. The shunt stub(s) provide at least one ESD discharge path and the load line(s) are coupled to the shunt stub(s) to provide loading effects for the shunt stub(s).

BRIEF DESCRIPTION OF THE DRAWINGS

The accompanying figures, where like reference numerals refer to identical or functionally similar elements throughout the separate views and which together with the detailed description below are incorporated in and form part of the specification, serve to illustrate various embodiments and to explain various principles and advantages in accordance with the present invention.

Skilled artisans will appreciate that elements in the figures are illustrated for simplicity and clarity and have not necessarily been drawn to scale. For example, the dimensions of some of the elements in the figures illustrating integrated circuit architecture may be exaggerated relative to other elements to help to improve understanding of the present and alternate embodiments.

DETAILED DESCRIPTION

The following detailed description is merely exemplary in nature and is not intended to limit the invention or the application and uses of the invention. Furthermore, there is no intention to be bound by any theory presented in the preceding background of the invention or the following detailed description of the invention.

The present embodiment as described herein introduces load lines to the conventional transmission lines in the implementation of electrostatic discharge (ESD) protection structures in accordance with the present embodiment. By utilizing the loading effects of these load lines, the physical dimensions of the loaded transmission lines are significantly reduced, thereby also reducing the loss brought by the ESD protection structures. In addition, the loaded transmission line can be designed to exhibit certain shunt impedance to serve as an element in a matching network of a protected input/output (I/O) pin. In this manner, the total area of the integrated circuits being protected by ESD structures in accordance with the present embodiment can be reduced significantly since the physical dimensions of the ESD structures are reduced and the ESD structures can also be acting as one element in the matching network of the protected I/O pin.

Figure 1:
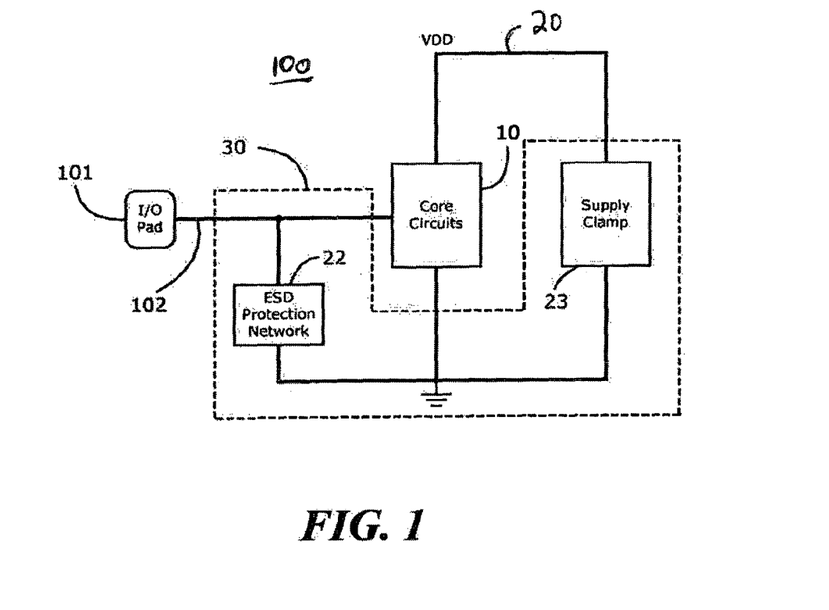
FIG. 1 illustrates a block diagram of an electrostatic discharge (ESD) protection scheme for an input/output (I/O) pin using an ESD protection network based on miniature passive structures in accordance with one embodiment of the disclosure.

Referring to FIG. 1, a block diagram 100 illustrates an ESD protection scheme for an I/O pin (via connection through I/O pad 101) using an ESD protection network 22 based on miniature passive structures in accordance with the present embodiment. The miniature passive structures are composed of transmission line stubs and load lines. The transmission lines establish a shunt connection from an input wire connection 102 between the I/O pad 101 and internal core circuits 10 to ground. The load lines add loading effects to the transmission lines, which advantageously reduce their required physical dimensions at interested frequency ranges for a given shunt impedance. As the miniature passive structures connect the wire connection 102 to ground, efficient bi-directional ESD protection between the I/O pad 101 and ground can easily be implemented.

To implement ESD protection against ESD stress between the I/O pad 101 and a power supply rail VDD 20, a conventional supply clamp 23 can be utilized. The ESD protection network 22 and the supply clamp 23 constitutes a complete ESD protection scheme 30 capable of protecting the core circuits 10 against both positive and negative ESD stress between the I/O pad 101 and ground, between I/O pad 101 and VDD 20, and between VDD 20 and ground.

The miniature passive structures of the ESD protection network 22 may also be connected between the wire connection 102 and the power supply rail VDD 20. In this permutation, the ESD stress between the I/O pad 101 and VDD 20 is handled by the ESD protection network 22 while the ESD stress between the I/O pad 101 and ground and VDD 20 and ground is handled by the ESD protection network 22 and the supply clamp 23.

Figure 2:
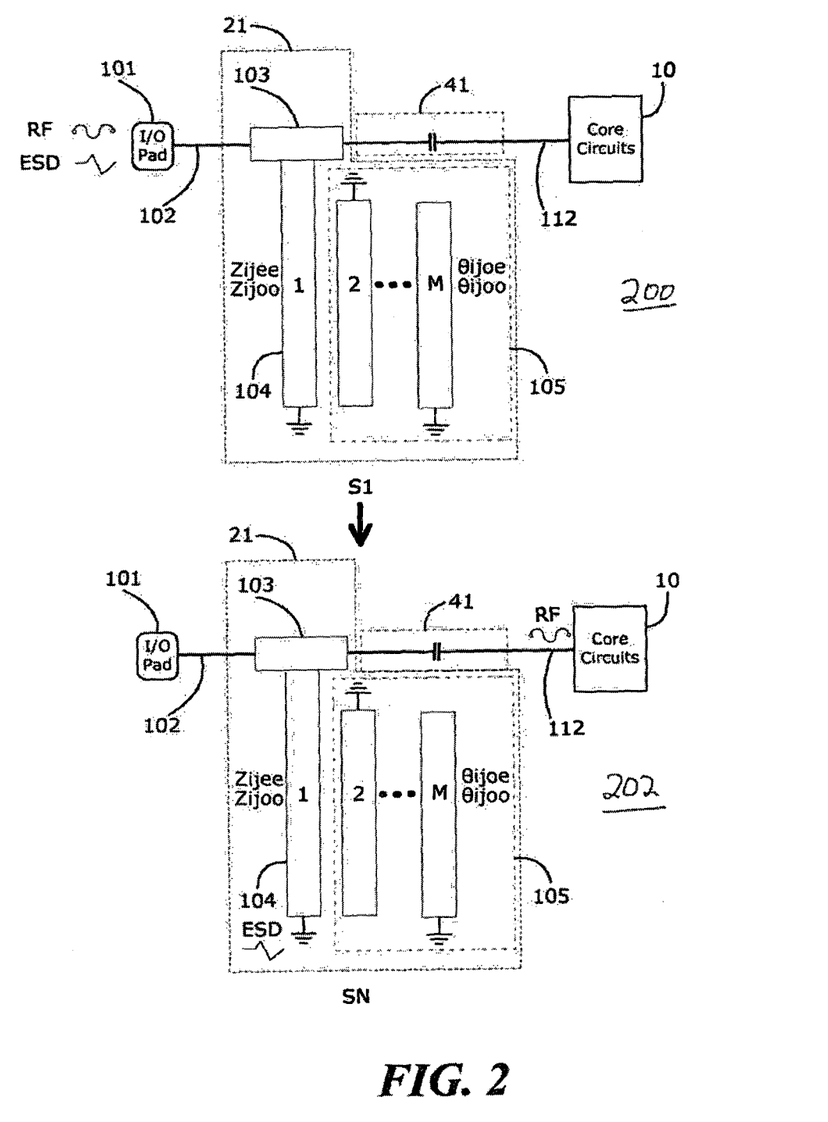
FIG. 2 illustrates top planar views of the ESD protection network of FIG. 1 using loaded shunt stubs with capacitive coupling to core circuits in accordance with the present embodiment.

Referring next to FIG. 2, illustrates two top planar views 200, 202 of the ESD protection network of FIG. 1 in accordance with the present embodiment. The first planar view 200 illustrates the ESD protection network in a state before the RF or ESD signal is injected (i.e., both the RF signal and the ESD signal are indicated to the left of the I/O pad 101). This state is denoted as state S1. The second planar view 202 illustrates the ESD protection network in a state after the RF and the ESD signal is injected (i.e., both the RF signal and the ESD signal are indicated to the left of the I/O pad 101). This state is denoted as state SN.

Both the RF and the ESD signal will travel toward the core circuits 10 through the wire connection 102 once they are applied on to the I/O Pad 101. For high frequency signal wire connections, a transmission line 103 of any type may be employed to implement a low-loss inter-connection. Conventionally, a transmission line shunt stub 104 is adopted to bypass the ESD signal to ground while exhibiting certain desirable impedance to the RF signal at interested frequencies. The present embodiment introduces load transmission lines 105 in addition to the conventional transmission line shunt stub 104. The transmission line shunt stub 104 and the load transmission lines 105 form coupled transmission lines which can reduce the physical dimension of the shunt stub 104, thereby reducing the required chip area and cost of the integrated circuit (IC) die. The load transmission lines 105 could be a single load line or multiple load lines with one terminal connected to ground in an interdigitated form as shown in FIG. 2. The loaded shunt stub, composed of the conventional transmission line shunt stub 104 and the single or multiple load lines 105, can be implemented in any form of a transmission line, including but not limited to a coplanar waveguide (CPW), a strip line, or a microstrip line.

The ESD protection structure in accordance with the present embodiment which is implemented using a loaded shunt stub has relatively lower loss because of its reduced physical dimension and thus reduces both resistive and radiation loss. Further, the number, physical dimension, position and spacing of the load lines are all available design variables so that the impedance of the reduced-length loaded shunt stub can be tuned to the desirable value for optimum impedance matching with the characteristics of each I/O port 101. The ESD protection structure 21, composed of the transmission line 103, the shunt stub 104 and the load lines 105, can be coupled to the core circuits 10 using a coupling capacitor 41, thereby blocking DC voltage of the core circuits 10 from leaking to ground while coupling the RF signal to the core circuits 10. The capacitor 41 can be connected to the core circuits 10 through a wire or transmission line connection 112.

As shown in FIG. 2, while the RF and ESD signal are injected at the I/O pad 101, the RF signal can travel through the ESD protection network 21 and the coupling capacitor and feed to the core circuits 10 through the wire connection 112 with low loss. The ESD signal, on the other hand, can be efficiently shunted to ground by the ESD protection structure 21 and, thus, causes no damage to the core circuits 10.

Figure 3:
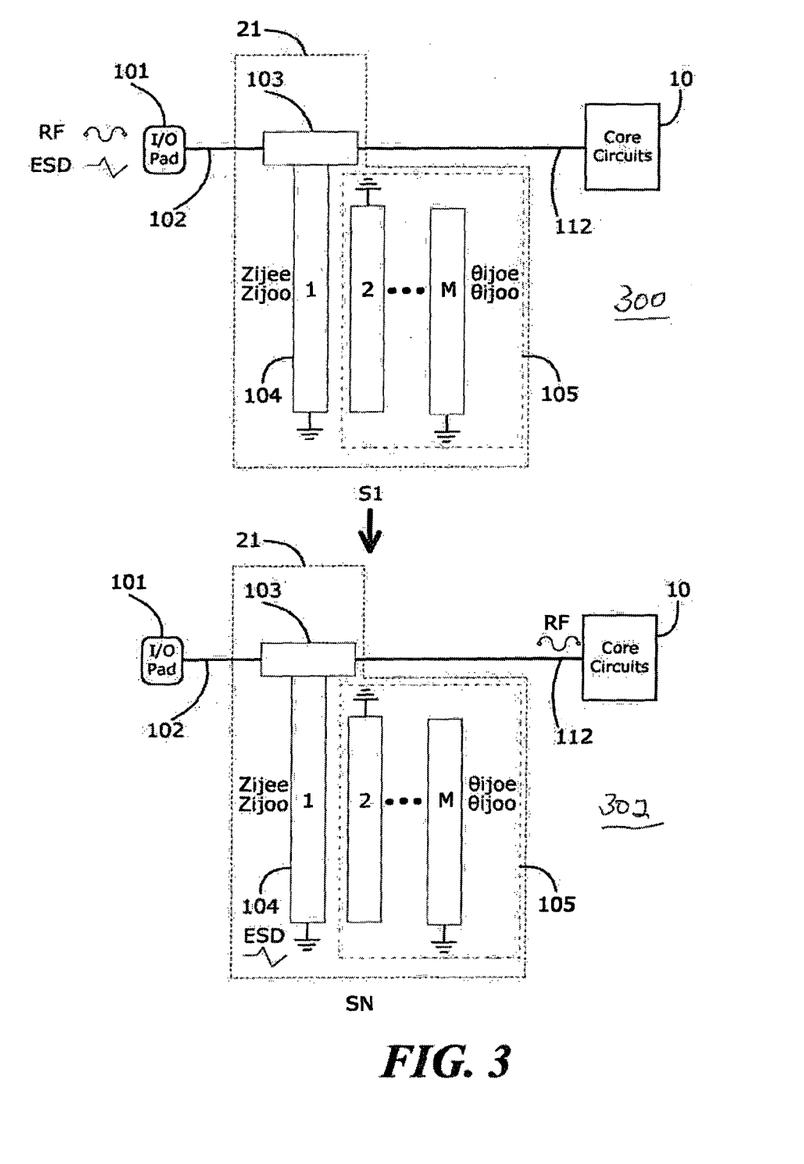
FIG. 3 illustrates planar views of the ESD protection network of FIG. 1 using loaded shunt stubs with direct coupling to the core circuits in accordance with the present embodiment.

FIG. 3 illustrates two top planar views 300, 302 of the ESD protection network of FIG. 1 in accordance with an alternate embodiment. The first planar view 300 illustrates the ESD protection network in a state before the RF or ESD signal is injected and, as before, is denoted as state S1. The second planar view 302 illustrates the ESD protection network in a state after the RF and the ESD signal is injected and is denoted as state SN.

The ESD protection network 21 of FIG. 3 is composed of the transmission line 103, the shunt stub 104 and the load lines 105, identical to the embodiment illustrated in FIG. 2. However, in accordance with the embodiment of FIG. 3, the RF signal, after traveling through the ESD protection network 21, is directly fed to the core circuits 10 by wire connection 112. At the same time, the ESD signal is shunted to ground through the shunt stub 104. In the embodiment of FIG. 3, the ESD protection network 21 still provides ESD protection and impedance matching functions for the core circuits. The DC level of the wire connection 112 is set to ground by the ESD protection network 103, wherein which the shunt stub 104 is connected directly to ground.

Such application is desirable should the core circuits 10 be operable with zero DC bias voltage at its input without any current leakage. For instance, when the core circuit 10 has both positive and negative supplies, the core circuits 10 should be operable with zero DC bias voltage at its input without any current leakage. Similarly, the loaded shunt stub, composed of the conventional transmission line shunt stub 104 and the single or multiple load lines 105, can be implemented in any form of transmission lines, including but not limited to a coplanar waveguide (CPW), a strip line, and a microstrip line and the shape of the transmission lines can also be modified into shapes such as spiral shapes or meandering lines to further reduce the required chip area. The introduction of the load lines 105 to the shunt stub effectively reduces the dimensions of the shunt stub and therefore the resistive and radiation loss are reduced as well as the die cost.

Figure 4:
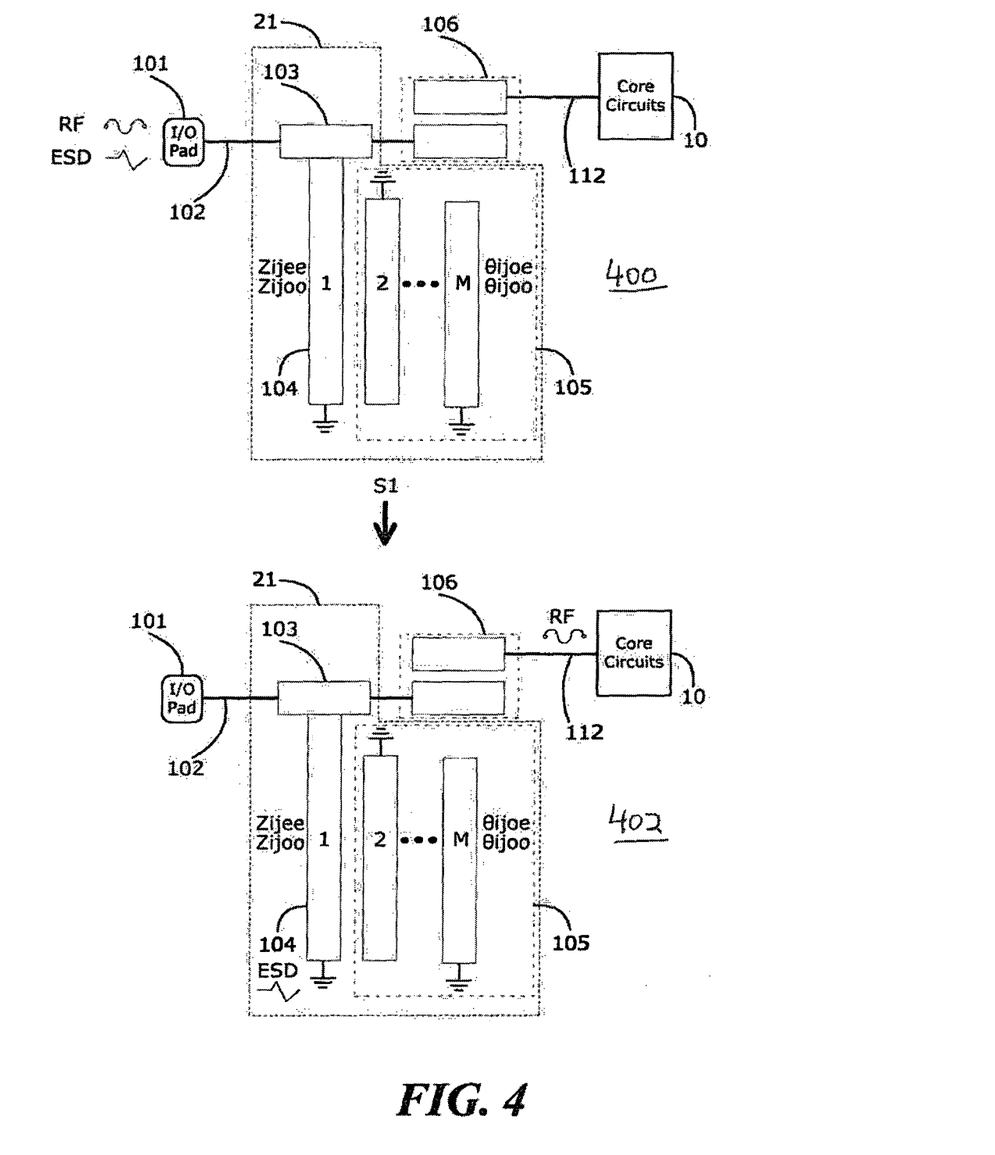
FIG. 4 illustrates planar views of the ESD protection network of FIG. 1 using loaded shunt stubs with a coupling line connecting to the core circuits in accordance with the present embodiment.

FIG. 4 illustrates planar views of the ESD protection network before 400 and after 402 injecting the RF and ESD signals in accordance with another embodiment. Instead of feeding the RF signal to the core circuits 10 directly as illustrated in FIG. 3 or through a coupling capacitor such as a metal-insulator-metal (MIM) capacitor or an inter-digital capacitor as illustrated in FIG. 2, the RF signal traveling through the ESD protection network 21 is fed to the core circuits through a coupling line 106. The coupling line 106 blocks the DC voltage of the core circuits 10 from leaking to the ground through the shunt stub 104 in the ESD network 21. Similarly, the ESD protection network 21 serves as a low loss band-pass structure for the RF signal, allowing interested frequencies to pass while shunting the ESD signal to ground.

The embodiment pictured in FIG. 4 allows for optimized matching of the ESD protection network 21 and the coupling line 106 to the I/O port. Utilizing respective design freedoms for both structures including but not limited to transmission line type, conductor shape, physical dimension and spacing, both the ESD protection network 21 and the coupling line 106 can serve as a matching element for the I/O port 101 to achieve optimum matching without introducing additional circuit elements.

Figure 5:
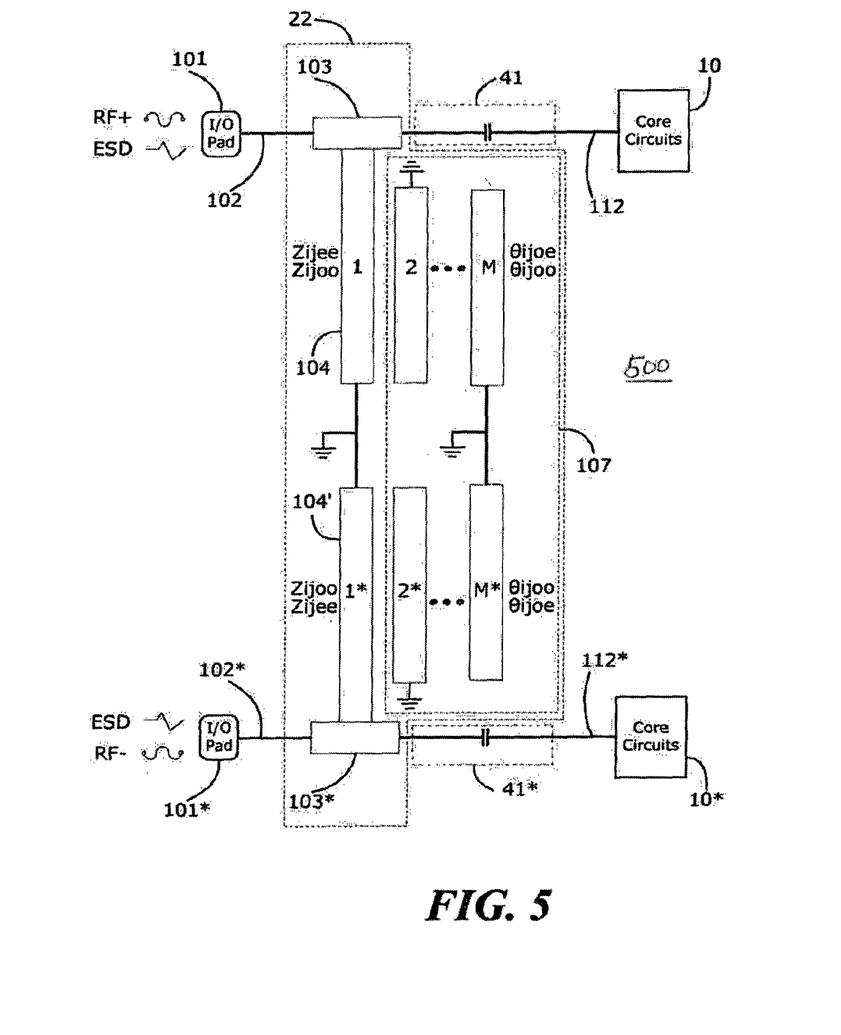
FIG. 5 illustrates a planar view of the ESD protection network of FIG. 1 for a differential I/O pin using loaded shunt stubs with capacitive coupling to the core circuits in accordance with the present embodiment.

Referring next to FIG. 5, a planar view 500 illustrates an embodiment of the ESD protection network 22 in its differential form. With the differential shunt stub 104, 104* and the differential load lines 107 sharing a common ground, ESD protection network 22 can be applied to a high speed differential I/O port. Either positive or negative ESD stress imposed on either I/O Pad 101, 101* can be bypassed to ground through the ESD shunt stub 104, 104*. In addition to the capacitive coupling through capacitors 41, 41*, the differential ESD protection network 22 implementation can be coupled to the core circuits 10, 10* using other methods, including but not limited to the direct coupling and coupling line coupling scenarios depicted in FIGS. 3 and 4 (e.g., where the capacitors 41 and 41* are replaced by coupled transmission lines and/or transmission lines or their modified structures).

Figure 6:
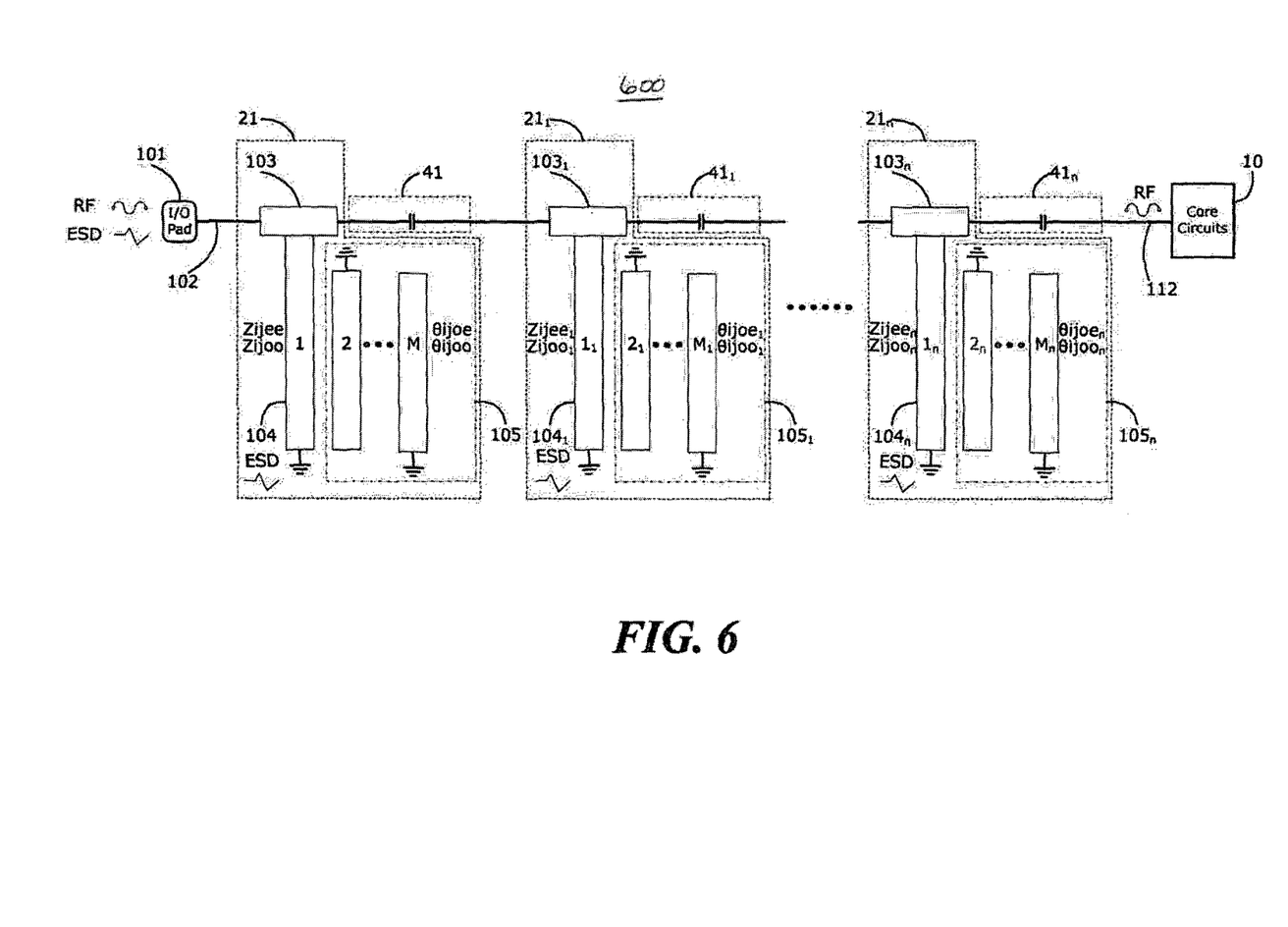
FIG. 6 illustrates a planar view of a distributed ESD protection network in accordance with the present embodiment which is based on cascading of the ESD protection network elements shown in FIG. 2.

FIG. 6 illustrates a planar view 600 of yet another embodiment of the present invention, in which the embodiment depicted in FIG. 2 is cascaded to form a distributed ESD protection network. Each of the cascaded embodiments are depicted as capacitively coupled. However, they are not limited to capacitor coupling types as the direct coupling type shown in FIG. 3 and the coupling type of coupled transmission lines shown in FIG. 4 are substitutable depending on the specific requirement of the ESD protection network composed of network elements 21, 21$_1$ . . . 21$_n$.

The number of the cascaded elements can be any number larger than one. The cascading of the ESD protection networks enhances the ESD survivability of the protected I/O port by introducing multiple distributed shunt stubs, all of which can carry ESD current while contributing to the matching networks. Such distributed ESD protection network can also be utilized for purposes including, but not limited to, enhancing the frequency selectivity of the I/O port or implementing a wideband matching network for the I/O port. The introduction of the load lines to these shunt stubs significantly reduces their physical dimension and the total area of a cascaded ESD protection network is also greatly reduced. Moreover, the design freedom introduced by multiple loads eases design trade-offs and makes the simultaneous achievement of multiple design goals possible.

Figure 7:
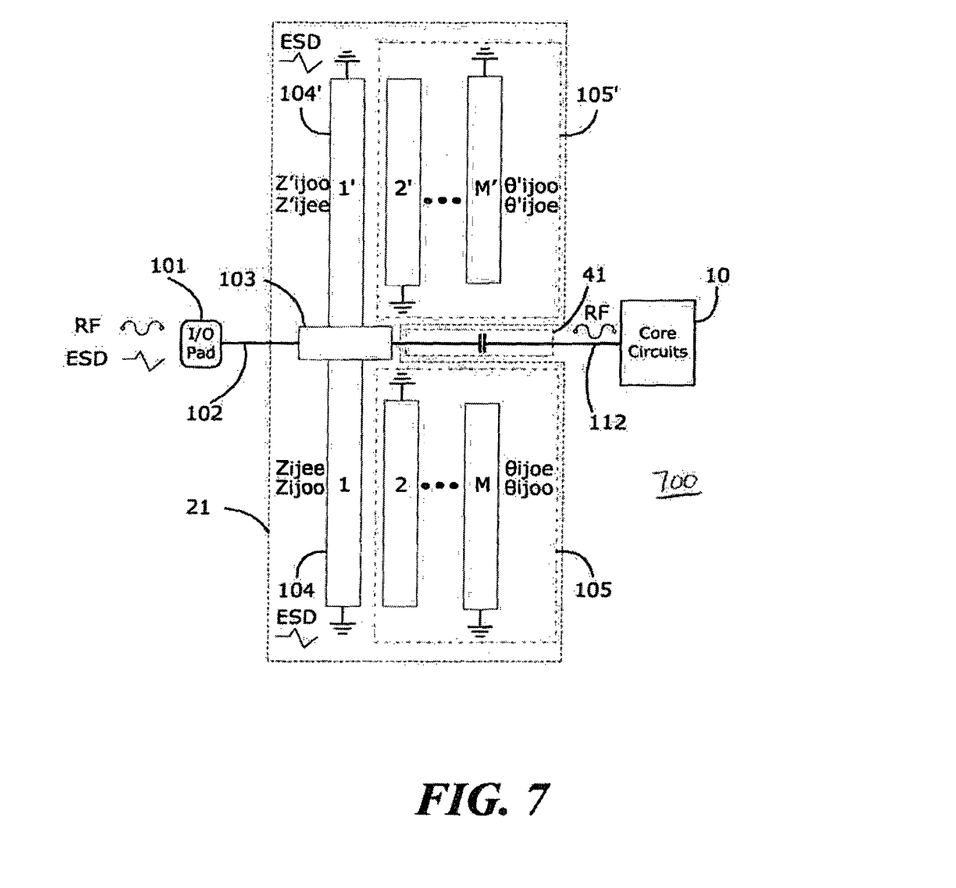
FIG. 7 illustrates a planar view of the ESD protection network in accordance with the present embodiment which includes two loaded shunt stubs.

FIG. 7 illustrates a planar view 700 of a further embodiment including two shunt stubs 104, 104' loaded with their respected load lines 105, 105'. The two loaded shunt stubs 104, 104' improve the ESD survivability of the protected integrated circuits since an additional ESD current discharge path is made available. Similarly, the number of the loaded shunt stubs can also be any number larger than two, thereby providing additional ESD current discharge paths for each additional shunt stub. Each of the loaded shunt stubs can share the same design parameters (e.g., characteristic impedance, physical dimension) or they can have different parameters determined in response to design and placement requirements. The multiple loaded shunt stubs can be placed at the same physical location of the signal carrying transmission line 103 or, alternatively, they can be placed at different physical locations long the signal carrying transmission line 103.

The embodiment shown in FIG. 7 employs a coupling capacitor 41 to couple the RF signal fed through the ESD protection network 21 to the core circuits 10. However, other coupling methods are applicable, including directly coupling and coupled lines coupling, where the capacitor 41 is replaced by coupled transmission lines and/or transmission lines or their modified structures.

Figure 8:
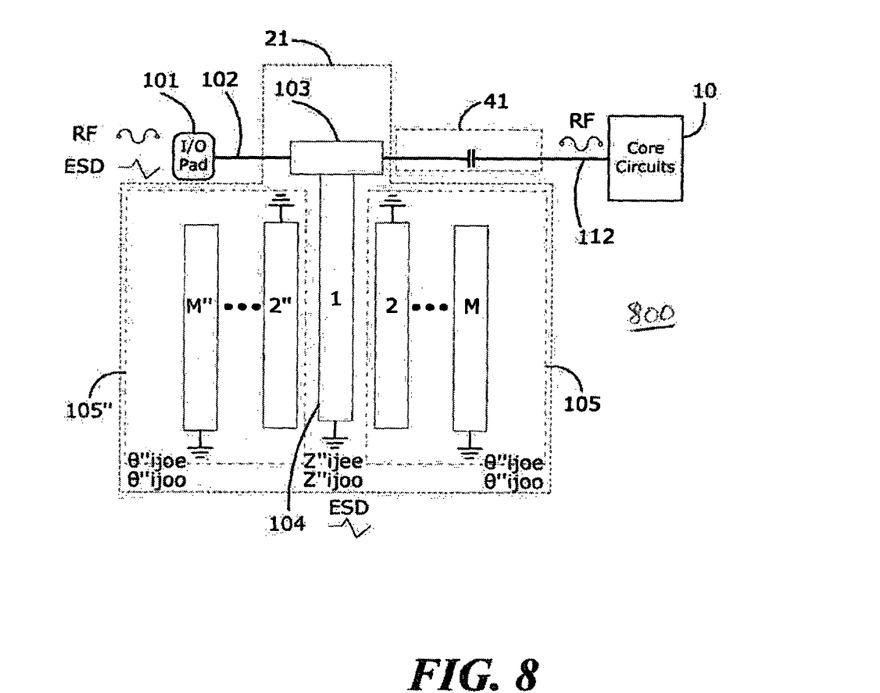
FIG. 8 illustrates a planar view of the ESD protection network of FIG. 1 including one shunt stub loaded with two sets of load lines in accordance with the present embodiment.

FIG. 8 illustrates a planar view 800 of the ESD protection network of FIG. 1 including one shunt stub loaded with two sets of load lines in accordance with another embodiment. The two sets of load lines 105, 105" are loaded to the shunt stub 104. The loading effect is enhanced in this implementation with the sets of load lines 105, 105" and, therefore, the physical dimension of the ESD protection network 21 can be further reduced. The number of load lines sets can also be any number larger than two. The load line sets can share the same design parameters such as characteristic impedance, physical dimension, and spacing, or they can have their respective different design parameters.

The embodiment shown in FIG. 8 employs a coupling capacitor 41 to couple the RF signal fed through the ESD protection network 21 to the core circuits 10. However, other coupling methods as discussed above are also applicable, including but not limited to direct coupling and coupled line coupling. The two sets of the ESD structures shown in FIG. 8 can also be used for differential drive conditions similar to the embodiment depicted in FIG. 5. The ESD structures shown in FIG. 8 can also be cascaded to multiple stages similar to the embodiment shown in FIG. 6.

Figure 9:
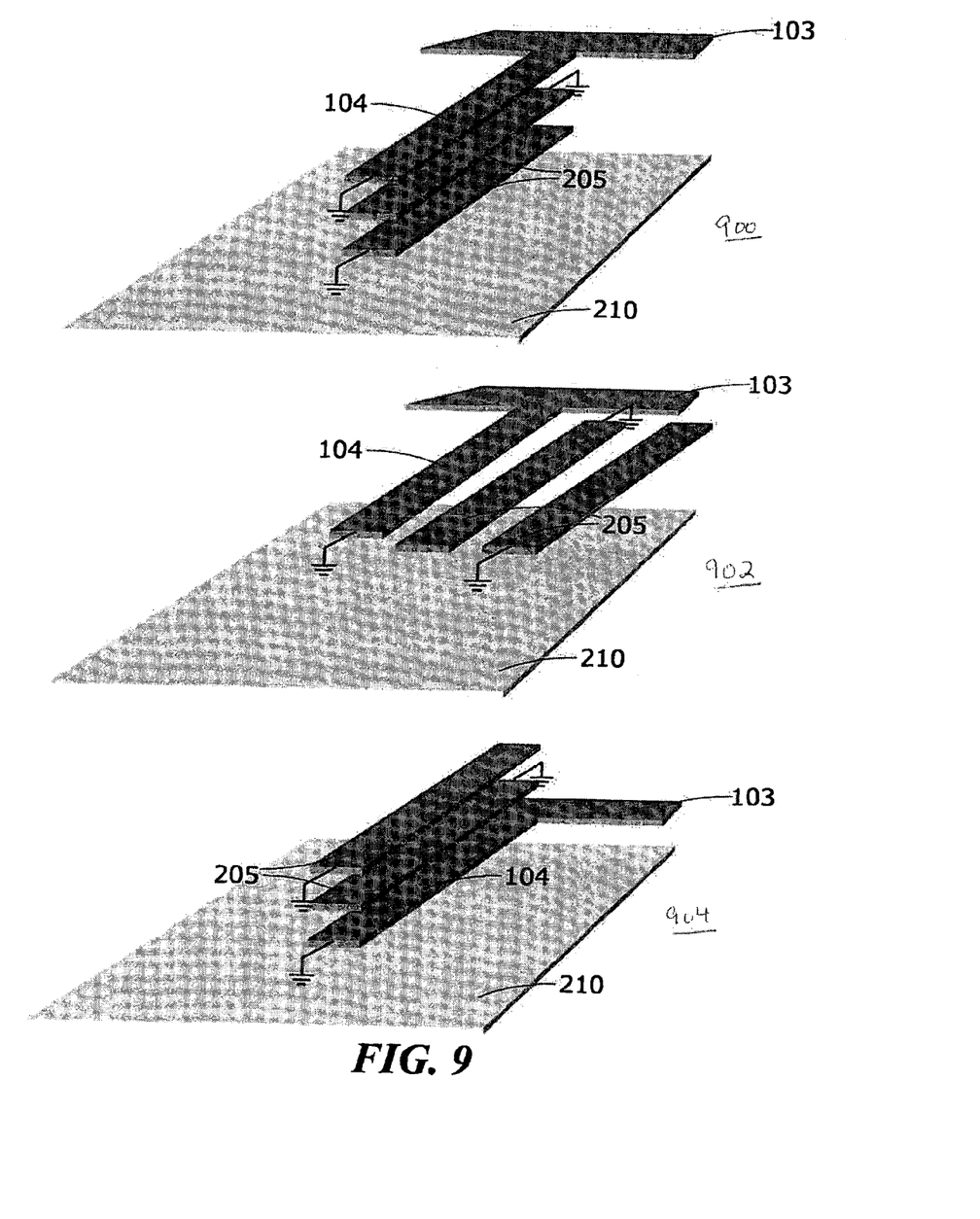
FIG. 9 illustrates a front, top, right perspective view of the ESD protection network of FIG. 1 showing three possible positionings of the shunt stubs in a microstrip line implementation in accordance with the present embodiment.

Referring to FIG. 9, three views 900, 902, 904 from front, top, right perspective of the ESD protection network of FIG. 1 depict three possible positionings of the shunt stubs 205 in a microstrip line implementation. The embodiment of FIG. 9 illustrates the positioning of the shunt stubs 205 and the load lines in which the number of the load lines is two. The three implementations are based on microstrip lines with ground plane 210.

The first positioning type depicted in perspective view 900 places the signal carrying transmission line 103 and the shunt stub 104 on a higher level metal while the two load lines 205 are added below. The second positioning type depicted in perspective view 902 places the two load lines 205 beside the shunt stub 104 on the same metal layer as the signal carrying transmission line 103 and the shunt stub 104. The third positioning type depicted in perspective view 904 places the signal carrying transmission line 103 and the shunt stub 104 on a lower level metal while the two load lines 205 are added above.

According to different requirements for the shunt stub and the load lines, the positioning could be any of the three types shown in FIG. 9, or a combination of the three types shown or a totally different type. For IC processes such as CMOS, SiGe BiCMOS and GaAs, the transmission line 103, the shunt stub 104 and the load lines 205 can be implemented on different metal layers in accordance with any specific process. The ground plane 210 can be implemented on the top or bottom metal layers of the IC process or as a conductive ground. The isolation materials between the different metal layers may be different dielectric layers or substrates such as $SiO_2$ or Silicon.

Figure 10:
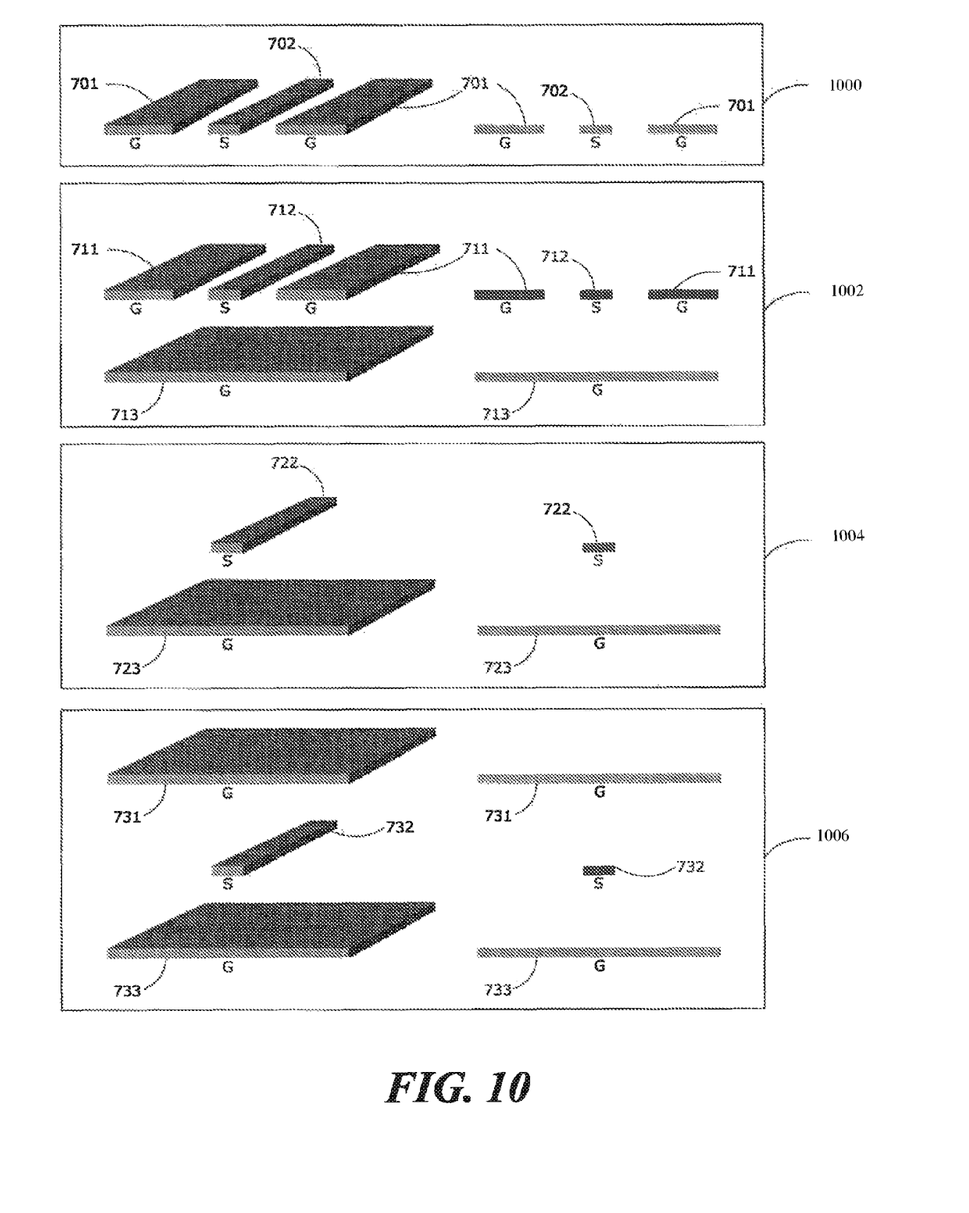
FIG. 10 illustrates front, top, right perspective views and front planar views of four possible transmission line structure types of the ESD protection network of FIG. 1 in accordance with present and alternate embodiments.

FIG. 10 illustrates some possible transmission line types to implement the signal carrying transmission line 103, the shunt stub 104 and the load lines 105 and includes front, top, right perspective views and front planar views of four possible transmission line structure types of the ESD protection network. The coplanar waveguide 1001 employs a center signal conductor 702 with two ground conductors 701 placed on both sides of the center conductor 702 at equal spacing. The coplanar waveguide with ground shield (CPWG) 1002 has a signal conductor 712 and two side ground conductors 711 similar to the CPW, but it has an additional ground conductor plane 713 under the conventional CPW transmission line. The microstrip line 1004 employs a signal conductor 722 with a ground conductor plan 723 at a different metal layer as the signal conductor 722. And the strip line 1006 has a signal conductor 732 and a ground conductor plane 733 similar to the microstrip line 1004; however, the strip line 1006 has an additional ground conductor plane 731 on the other side, symmetric with the first ground conductor plane 733 with reference to the center conductor 732. The implementation of the transmission line 103, the shunt stub 104, the load lines 105 and other transmission lines in accordance herewith could be based on one or several types of the transmission line structures shown in FIG. 8. However, other implementations are also possible. For IC processes such as CMOS, SiGe BiCMOS and GaAs, conductors 701, 702, 711, 712, 722, 732 can be implemented on different metal layers in accordance with any specific process. Ground planes 713, 723, 731 and 733 can be implemented on the top or bottom metal layers of the IC process or on a conductive ground layer. The isolation material between the different metal layers may be different dielectric layers or substrates such as $SiO_2$ or Silicon.

Figure 11:
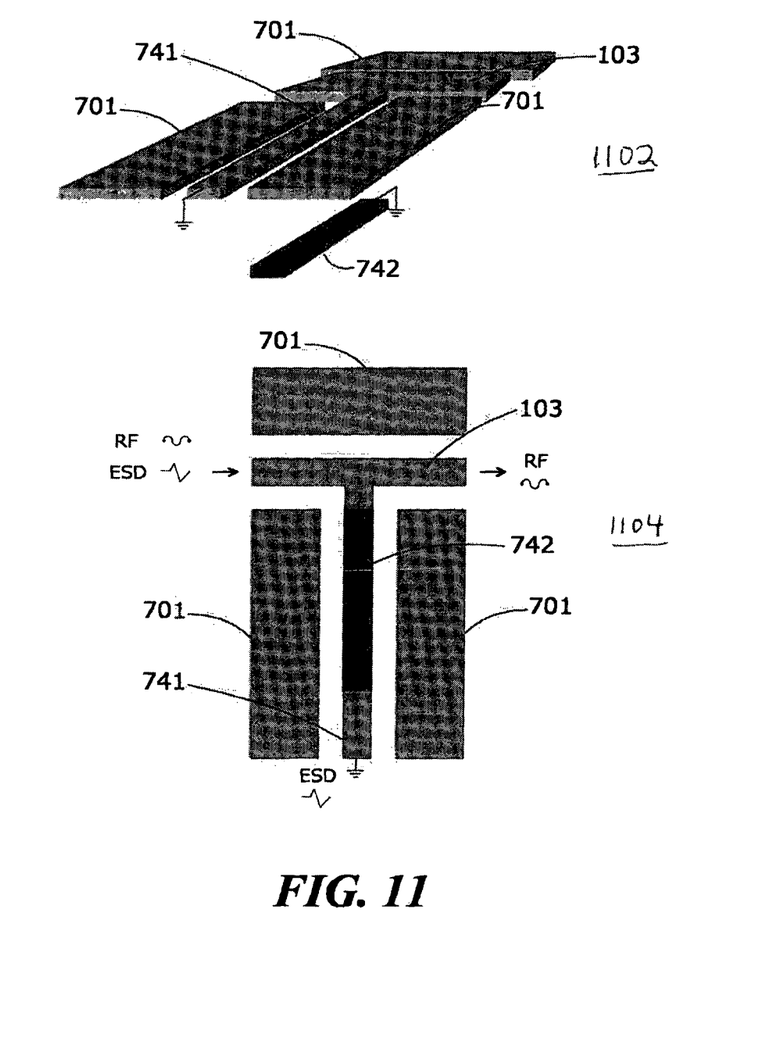
FIG. 11 illustrates a front, top, right perspective view and a top planar view of an implementation of the ESD protection network of FIG. 1 in accordance with present embodiment and including conventional coplanar waveguide (CPW) structures.

FIG. 11 illustrates a front, top, right perspective view 1102 and a top planar view 1104 using conventional CPW transmission lines for both the signal carrying transmission line 103 and the shunt stub 741. The load line 742 is introduced at a lower metal layer in an effort to reduce the length of the shunt stub. The options of the thickness of the dielectric layer between the shunt stub 741 and the load line 742 is determined by the specific process technology adopted. Once the thickness is chosen, the physical dimensions of the shunt stub 741 and the load line 742 can be determined to achieve desirable shunt impedance. The total length of the shunt stub 741 can be reduced significantly by the introduction of the load line 742. The loss of the ESD shunt stub 741 is also reduced due to the reduced length thereof.

Figure 12:
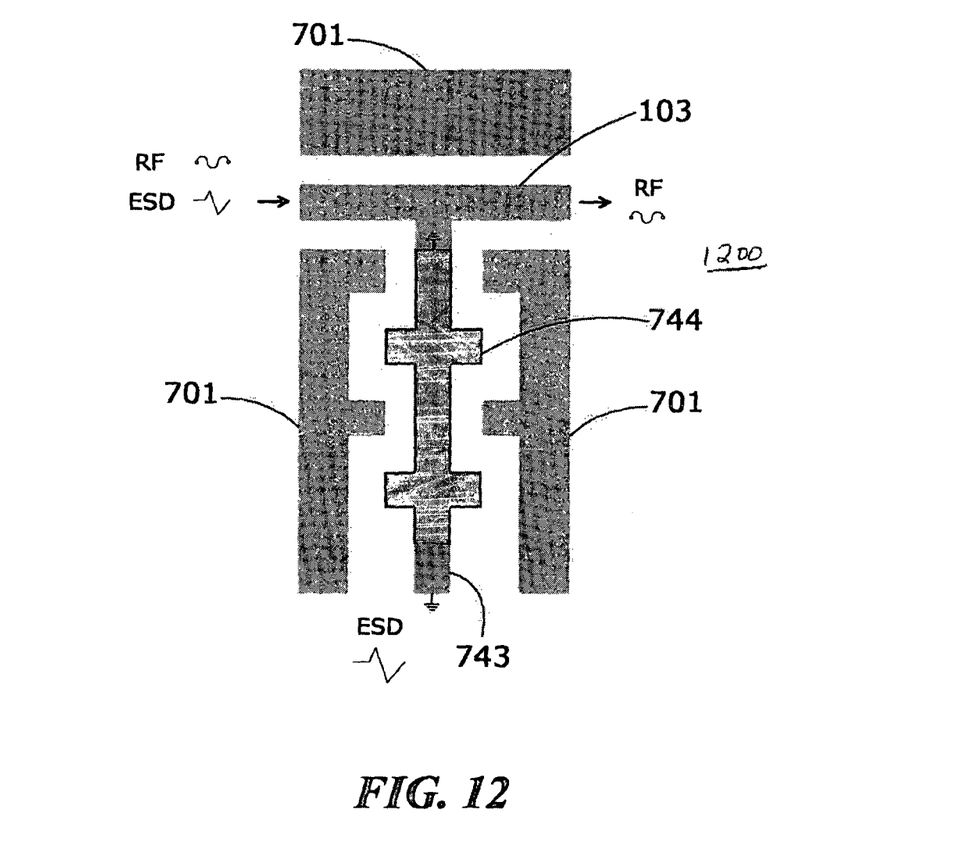
FIG. 12 illustrates a top planar view of an implementation of the ESD protection network of FIG. 1 in accordance with present embodiment and including customized CPW structures.

Referring next to FIG. 12, a top planar view 1200 of an implementation of the ESD protection network including customized CPW structures is illustrated. The view 1200 is a derivative of the implementations 900, 902 and 904. The conventional CPW transmission line type is kept for the signal carrying transmission line. However, the transmission line type for the shunt stub 743 and the load line 744 is modified to a non-conventional shape. With the customized shape for the shunt stub 734 and load line 744, the total length of the shunt stub can be further reduced. Thus, the loss due to the ESD protection network and its physical dimensions can also be further reduced. With the design freedom available from the physical dimension of the shunt stub 743 and the load line 744 as well as the thickness of the dielectric layer between them and other design parameters, the impedance of the ESD protection network can be designed to achieve optimum matching for the core circuits 10.

Thus it can be seen that several schemes of distributed ESD protection devices to absorb the parasitic effects of the protection devices in a transmission line have been disclosed which advantageously provide reduced physical dimensions of loaded transmission lines while reducing the loss brought by the ESD protection structures. Further, improved ESD protection is achieved while reducing integrated circuit cost and IC real estate required for ESD protection structures. A series of miniature passive structures that can be employed to implement ESD protection as well as I/O port matching for RF, micro-wave and millimeter-wave integrated circuits IC and systems have been disclosed.

The miniature passive structures are composed of various shunt stubs with their terminals connected to ground or power supply rails for efficiently shunting the deteriorating ESD current and purposely-introduced load lines for these shunt stubs for allowing dimension reduction of the shunt stubs. By adjusting the available design variables, such as the shape, physical dimension, positioning or the miniature passive structures, the RF, microwave or millimeter-wave signal at the interested frequencies could feed through this ESD protection network with low loss due to the small physical dimension of the passive structures. While designed purposely to exhibit certain shunt impedance, these ESD protection miniature passive structures can also act as matching elements in the input and output network of the circuit under protection, further reducing the size of the integrated circuits. While several exemplary embodiments have been presented in the foregoing detailed description of the invention, it should be appreciated that a vast number of variations exist, including variations as to the materials used to form the various layers of the magnetic recording medium.

Various embodiments may provide a miniature passive structure for electrostatic discharge (ESD) protection and input/output (I/O) matching for a high frequency integrated circuit, the structure including at least one shunt stub for providing a corresponding at least one ESD discharge path; and at least one load line a first end open-ended and a second end connected to the ground coupled to the at least one shunt stub, the at least one load line providing loading effects for the at least one shunt stub.

In various embodiments, the miniature passive structure may further include an input signal trace, wherein the at least one shunt stub may be DC connected to the input signal trace at a first end and DC connected to ground at a second end.

In other embodiments, the miniature passive structure may further include an input signal trace, wherein the at least one shunt stub may be DC connected to the input signal trace at a first end and AC coupled or DC connected to one supply rail at a second end.

In various embodiments, the at least one shunt stub may include a structure selected from the group including a coplanar waveguide, a coplanar waveguide with a ground shield, a microstrip line, and a strip line.

In various embodiments, the at least one load line may include a structure selected from the group including a coplanar waveguide, a plurality of coplanar waveguides, a coplanar waveguide with a ground shield, a plurality of coplanar waveguides with ground shields, a microstrip line, a plurality of microstrip lines, a strip line, and a plurality of strip lines. One or more of the at least one load line may be coupled to one or more of the at least one shunt stub to achieve low current loss and miniature size, coupling between the one or more of the at least one load line and the one or more of the at least one shunt stub may include a coupling selected from the group of couplings including AC coupling, radio frequency coupling, and millimeter-wave signal coupling.

In various embodiments, the miniature passive structure may include a plurality of metallization layers in an integrated circuit wherein the at least one shunt stub may be formed in a first layer of the plurality of metallization layers and the at least one load line may be formed in a second layer of the plurality of metallization layers, and the first layer of the plurality of metallization layers may be formed higher within the integrated circuit than the second layer of the plurality of metallization layers.

In various embodiments, the miniature passive structure incorporated in an integrated circuit may include a plurality of metallization layers wherein the at least one shunt stub may be formed in a first layer of the plurality of metallization layers and the at least one load line may be formed in a second layer of the plurality of metallization layers, and the first layer of the plurality of metallization layers may be formed lower within the integrated circuit than the second layer of the plurality of metallization layers.

In other embodiments, the miniature passive structure incorporated in an integrated circuit may include one or more metallization layers wherein the at least one shunt stub and the at least one load line may be formed in a same one of the one or more metallization layers.

In various embodiments, the at least one shunt stub may include a plurality of shunt stubs, and the at least one load line may include a plurality of load lines, and two or more of the plurality of shunt stubs and a corresponding two or more of the plurality of load lines may be connected to the input signal trace at either a same or a different point along the input signal trace to provide one or more of multiple ESD discharge paths and adjustable elements for input/output impedance matching for high frequency applications.

In various embodiments, the at least one shunt stub may include at least one shunt transmission line stub, and the at least one load line may include at least one load transmission line. The at least one shunt stub and the at least one load line may be formed into one or more shapes to reduce size of the miniature passive structure for ESD protection, the one or more shapes selected from the group of shapes including a straight line shape, a spiral shape and a meandering line shape. One or more of the at least one shunt stub and the at least one load line may include one or more smaller open stubs therealong for slow-wave loaded line performance thereof.

Various embodiments may provide a high frequency electrostatic discharge (ESD) protection network for integrated circuits including a high frequency signal carrying transmission line; and one or more miniature passive structures, each of the one or more miniature passive structures including: at least one shunt stub for providing a corresponding at least one ESD discharge path; and at least one load line coupled to the at least one shunt stub, the at least one load line providing loading effects for the at least one shunt stub, wherein the integrated circuits are based on an integrated circuit technology selected from the group comprising CMOS, GaAs, SiGe, and InP.

In various embodiments, the high frequency ESD protection network may be coupled to core circuits of the integrated circuits by capacitive coupling selected from the group including capacitor coupling and coupled transmission line coupling for one or more of protection of the core circuits and DC bias of the core circuits.

In other embodiments, the high frequency ESD protection network may be coupled to core circuits of the integrated circuits by direct connection for protection of the core circuits.

In yet other embodiments, differential configuration of the high frequency ESD protection network may provide ESD protection for differential input/output ports.

In various embodiments, the high frequency ESD protection network may further include a plurality of ESD discharge paths wherein cascading of the high frequency ESD protection network may distribute ESD current into multiple ones of the plurality of ESD discharge paths.

In various embodiments, the high frequency ESD protection network may act as an element in an input/output matching network.

In various embodiments, the at least one shunt stub may include at least one shunt transmission line stub, and the at least one load line may include at least one load transmission line.

In various embodiments, the at least one shunt stub and the at least one load line may be formed into one or more shapes to reduce size of the miniature passive structure for ESD protection, the one or more shapes selected from the group of shapes including a straight line shape, a spiral shape and a meandering line shape. One or more of the at least one shunt stub and the at least one load line may include one or more smaller open stubs connected therealong for slow-wave loaded line performance thereof.

Various embodiments may provide a high frequency electrostatic discharge (ESD) protection scheme for integrated circuits including power supply rails; a supply clamp, providing transient clamping of the electrical potential difference between the power supply rails; and a high frequency ESD protection network including: a high frequency signal carrying transmission line; and one or more miniature passive structures, each of the one or more miniature passive structures including: at least one shunt stub for providing a corresponding at least one ESD discharge path; and at least one load line coupled to the at least one shunt stub, the at least one load line providing loading effects for the at least one shunt stub.

In various embodiments, the high frequency ESD protection scheme may further include an input/output (I/O) pin, and the power supply rails may include a positive power supply rail and a negative power supply rail, and the high frequency ESD protection scheme may provide ESD stress for the integrated circuits, the ESD stress selected from the group including (a) positive ESD stress at the I/O pin with reference to the negative power supply rail, (b) negative ESD stress at the I/O pin with reference to the negative power supply rail, (c) positive ESD stress at the I/O pin with reference to the positive power supply rail, (d) negative ESD stress at the I/O pin with reference to the positive power supply rail, (e) positive ESD stress at the positive power supply rail with reference to the negative power supply rail, and (f) negative ESD stress at the positive power supply rail with reference to the negative power supply rail.

In various embodiments, the at least one shunt stub may include at least one shunt transmission line stub, and the at least one load line may include at least one load transmission line.

In various embodiments, the at least one shunt stub and the at least one load line may be formed into one or more shapes to reduce size of the miniature passive structure for ESD protection, the one or more shapes selected from the group of shapes including a straight line shape, a spiral shape and a meandering line shape.

In various embodiments, one or more of the at least one shunt stub and the at least one load line may include one or more smaller open stubs connected along the at least one load line for slow-wave loaded line performance thereof.

It should further be appreciated that the exemplary embodiments are only examples, and are not intended to limit the scope, applicability, dimensions, or configuration of the invention in any way. Rather, the foregoing detailed description will provide those skilled in the art with a convenient road map for implementing an exemplary embodiment of the invention, it being understood that various changes may be made in the function and arrangement of elements and method of play steps described in an exemplary embodiment without departing from the scope of the invention as set forth in the appended claims.

What is claimed is:

1. A miniature passive structure for electrostatic discharge (ESD) protection and input/output (I/O) matching for a high frequency integrated circuit, the structure comprising:
   at least one shunt stub for providing a corresponding at least one ESD discharge path; and
   at least one load line having a first end open-ended and a second end connected to the ground, wherein the at least one load line is coupled to the at least one shunt stub and provides loading effects for the at least one shunt stub.

2. The miniature passive structure in accordance with claim 1 further comprising an input signal trace, wherein the at least one shunt stub is DC connected to the input signal trace at a first end and at least one of:
   DC connected to ground at a second end;
   AC coupled to one supply rail at a second end; or
   DC connected to one supply rail at a second end.

3. The miniature passive structure in accordance with claim 1 wherein the at least one shunt stub comprises a structure selected from the group consisting of a coplanar waveguide, a coplanar waveguide with a ground shield, a microstrip line, and a strip line.

4. The miniature passive structure in accordance with claim 1 wherein the at least one load line comprises a structure selected from the group comprising consisting of a coplanar waveguide, a plurality of coplanar waveguides, a coplanar waveguide with a ground shield, a plurality of coplanar waveguides with ground shields, a microstrip line, a plurality of microstrip lines, a strip line, and a plurality of strip lines.

5. The miniature passive structure in accordance with claim 1 wherein one or more of the at least one load line are coupled to one or more of the at least one shunt stub to achieve low current loss and miniature size, coupling between the one or more of the at least one load line and the one or more of the at least one shunt stub comprises a coupling selected from the group of couplings comprising consisting of AC coupling, radio frequency coupling, and millimeter-wave signal coupling.

6. The miniature passive structure in accordance with claim 1 comprising a plurality of metallization layers in an integrated circuit wherein the at least one shunt stub is formed in a first layer of the plurality of metallization layers and the at least one load line is formed in a second layer of the plurality of metallization layers, and where in the first layer of the plurality of metallization layers is formed higher within the integrated circuit than the second layer of the plurality of metallization layers.

7. The miniature passive structure in accordance with claim 1 incorporated in an integrated circuit comprising a plurality of metallization layers wherein the at least one shunt stub is formed in a first layer of the plurality of metallization layers and the at least one load line is formed in a second layer of the plurality of metallization layers, and where in the first layer of the plurality of metallization layers is formed lower within the integrated circuit than the second layer of the plurality of metallization layers.

8. The miniature passive structure in accordance with claim 1 incorporated in an integrated circuit comprising one or more metallization layers wherein the at least one shunt stub and the at least one load line are formed in a same one of the one or more metallization layers.

9. The miniature passive structure in accordance with claim 2 wherein the at least one shunt stub comprises a plurality of shunt stubs, and wherein the at least one load line comprises a plurality of load lines, and wherein two or more of the plurality of shunt stubs and a corresponding two or more of the plurality of load lines are connected to the input signal trace at either a same or a different point along the input signal trace to provide one or more of multiple ESD discharge paths and adjustable elements for input/output impedance matching for high frequency applications.

10. The miniature passive structure in accordance with claim 1 wherein the at least one shunt stub includes at least one shunt transmission line stub, and wherein the at least one load line includes at least one load transmission line.

11. The miniature passive structure in accordance with claim 1 wherein the at least one shunt stub and the at least one load line are formed into one or more shapes to reduce size of the miniature passive structure for ESD protection, the one or more shapes selected from the group of shapes consisting of a straight line shape, a spiral shape and a meandering line shape.

12. The miniature passive structure in accordance with claim 1 wherein one or more of the at least one shunt stub and the at least one load line include one or more smaller open stubs therealong for slow-wave loaded line performance thereof.

13. A high frequency electrostatic discharge (ESD) protection network for integrated circuits comprising:
   a high frequency signal carrying transmission line; and
   one or more miniature passive structures, each of the one or more miniature passive structures comprising:
   at least one shunt stub for providing a corresponding at least one ESD discharge path; and
   at least one load line having a first end open-ended and a second end connected to the ground, wherein the at least one load line is coupled to the at least one shunt stub and provides loading effects for the at least one shunt stub,
   wherein the integrated circuits are based on an integrated circuit technology selected from the group consisting of CMOS, GaAs, SiGe, and InP.

14. The high frequency ESD protection network in accordance with claim 13 wherein differential configuration of the high frequency ESD protection network provides ESD protection for differential input/output ports.

15. The high frequency ESD protection network in accordance with claim 13 wherein the at least one shunt stub includes at least one shunt transmission line stub, and wherein the at least one load line includes at least one load transmission line.

16. The high frequency ESD protection network in accordance with claim 13 wherein the at least one shunt stub and the at least one load line are formed into one or more shapes to reduce size of the miniature passive structure for ESD protection, the one or more shapes selected from the group of shapes comprising a straight line shape, a spiral shape and a meandering line shape.

17. The high frequency ESD protection network in accordance with claim 13 wherein one or more of the at least one shunt stub and the at least one load line include one or more smaller open stubs connected therealong for slow-wave loaded line performance thereof.

18. A high frequency electrostatic discharge (ESD) protection scheme for integrated circuits comprising:
   power supply rails;
   a supply clamp, providing transient clamping of the electrical potential difference between the power supply rails; and
   a high frequency ESD protection network comprising:
   a high frequency signal carrying transmission line; and
   one or more miniature passive structures, each of the one or more miniature passive structures comprising:
   at least one shunt stub for providing a corresponding at least one ESD discharge path; and
   at least one load line having a first end open-ended and a second end connected to the ground, wherein the at least one load line is coupled to the at least one shunt stub and provides loading effects for the at least one shunt stub.

19. The high frequency ESD protection scheme in accordance with claim 18 wherein the at least one shunt stub includes at least one shunt transmission line stub, and wherein the at least one load line includes at least one load transmission line.

20. The high frequency ESD protection scheme in accordance with claim 18 wherein the at least one shunt stub and the at least one load line are formed into one or more shapes to reduce size of the miniature passive structure for ESD protection, the one or more shapes selected from the group of shapes consisting of a straight line shape, a spiral shape and a meandering line shape.

* * * * *